United States Patent
Fujiwara (10) Patent No.: US 6,603,679 B2
(45) Date of Patent: Aug. 5, 2003

(54) COUPLING COEFFICIENT MEASURING METHOD AND COUPLING COEFFICIENT MEASURING APPARATUS FOR SEMICONDUCTOR MEMORY

(75) Inventor: Hideaki Fujiwara, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 31 days.

(21) Appl. No.: 10/084,938

(22) Filed: Mar. 1, 2002

(65) Prior Publication Data

US 2002/0126530 A1 Sep. 12, 2002

(30) Foreign Application Priority Data

Mar. 5, 2001 (JP) ........................................ 2001-060631

(51) Int. Cl.[7] .............................................. G11C 16/04
(52) U.S. Cl. ............................ 365/185.01; 365/185.24; 365/185.26
(58) Field of Search .................. 365/185.01, 185.14, 365/185.24, 185.26, 185.33, 185.11, 226

(56) References Cited

U.S. PATENT DOCUMENTS 5,077,691 A * 12/1991 Haddad et al. ......... 365/185.23
5,969,991 A * 10/1999 Van Houdt et al. ..... 365/185.28

* cited by examiner

Primary Examiner—Thong Q. Le
(74) Attorney, Agent, or Firm—Arent Fox Kintner Plotkin & Kahn, PLLC (57) ABSTRACT

A coupling coefficient measuring method for a semiconductor memory capable of directly measuring a coupling coefficient in an actual cell without employing a specific test structure including a non-floating gate electrode or the like is obtained. In this coupling coefficient measuring method for a semiconductor memory, first and second subthreshold currents are measured by changing a drain voltage and increasing a source voltage and thereafter a first source voltage corresponding to a first value of the first subthreshold current and a second source voltage corresponding to a second value of the second subthreshold current equal to the first value are read while the ratio of the difference between the first drain voltage and the second drain voltage to the difference between the first source voltage and the second source voltage is calculated. Thus, the coupling coefficient between the first gate electrode and a source region can be obtained in an actual cell without providing a specific test structure including a non-floating gate electrode or the like, dissimilarly to the prior art.

17 Claims, 9 Drawing Sheets

COUPLING COEFFICIENT MEASURING METHOD AND COUPLING COEFFICIENT MEASURING APPARATUS FOR SEMICONDUCTOR MEMORY

BACKGROUND OF THE INVENTION

1. Field of the Invention

The present invention relates to a coupling coefficient measuring method and a coupling coefficient measuring apparatus for a semiconductor memory, and more specifically, it relates to a coupling coefficient measuring method and a coupling coefficient measuring apparatus for a nonvolatile semiconductor memory such as a flash memory.

2. Description of the Prior Art

A nonvolatile semiconductor memory such as an EPROM (erasable and programmable read only memory) or an EEPROM (electrically erasable and programmable read only memory) is recently watched with interest as a semiconductor memory capable of substituting for a hard disk and a floppy disk, which are magnetic memories.

A memory cell of an EPROM or an EEPROM stores carriers in a floating gate electrode for storing data in response to presence/absence of the carriers and reading data by detecting change of a threshold voltage responsive to presence/absence of the carriers. In particular, the EEPROM includes a flash EEPROM erasing data in the overall memory cell array or dividing the memory cell array into arbitrary blocks for erasing data in units of the blocks. The flash EEPROM is also referred to as a flash memory. The flash memory, capable of increasing the capacity, reducing the power consumption and increasing the speed and excellent in impact resistance, is used in various portable apparatuses. Each memory cell of the flash memory is formed by a single transistor, to advantageously enable easier integration as compared with an EEPROM.

In general, stacked gate and split gate memory cells are proposed for forming such a flash memory.

The stacked gate memory cell injects electrons stored in a channel of a semiconductor substrate into a floating gate electrode as hot electrons in a write operation of storing electrons in the floating gate electrode. At this time, a voltage of 10-odd V must be applied to a control gate electrode. In the stacked gate memory cell, a Fowler-Nordheim tunnel current (hereinafter referred to as an F-N tunnel current) is fed from a source or drain region to the floating gate electrode in an erase operation of extracting electrons stored in the floating gate electrode. At this time, a voltage of 10-odd V must be applied between the source or drain region and the floating gate electrode.

The split gate memory cell injects electrons stored in a channel of a semiconductor substrate into a floating gate electrode as hot electrons in a write operation of storing electrons in the floating gate electrode. At this time, a voltage of 10-odd V must be applied to a drain region. In the split gate memory cell, an F-N tunnel current is fed from a control gate electrode to the floating gate electrode in an erase operation of extracting electrons stored in the floating gate electrode. At this time, a voltage of 10-odd V must be applied to the control gate electrode.

Thus, each of the conventional stacked gate and split gate memory cells utilizes hot electrons for injecting electrons into the floating gate electrode in the write operation while utilizing the F-N tunnel current for extracting the electrons stored in the floating gate electrode in the write operation.

In the flash memory, the coupling coefficient between the floating gate electrode and the source region and that between the floating gate electrode and the control gate electrode are important parameters. These coupling coefficients decide controllability in erasing, writing and reading.

In order to control the potential of a floating gate electrode with the minimum voltage (power) in a general split gate flash memory controlling the potential of the floating gate electrode by electrostatic coupling from a source region, the coupling ratio between the source region (source diffusion layer) and the floating gate electrode must be sufficiently large. In this case, it is important to optimize cell creation conditions by correctly measuring the coupling ratio in the stage of development.

In general, the coupling ratio between the floating gate electrode and the control gate electrode is measured through a non-floating gate electrode (NFG) having a test structure. More specifically, a voltage is directly applied to the non-floating gate electrode whose voltage can be controlled by an external power source for measuring a subthreshold current, while the voltage of a control gate electrode is increased in an actual cell for measuring a subthreshold current. The ratio of inclinations (S values) of these subthreshold currents is calculated thereby measuring the coupling coefficient between the floating gate electrode and the control gate electrode. As to the split gate flash memory related to the present invention, it is recognized that the magnitude of coupling between elements other than "a source and a control gate" and a floating gate is extremely small. Therefore, the coupling ratio between the floating gate electrode and the source region important in writing is calculated by subtracting the coupling coefficient between the floating gate electrode and the control gate electrode from 1.

In the aforementioned method of measuring the coupling coefficient with the test structure including the non-floating gate electrode, however, it is difficult to independently form an external wire connected to the non-floating gate electrode following refinement of the cell, disadvantageously leading to difficulty in formation of the test structure. Following refinement of the cell, further, the shape of the actual cell may differ from that of the cell of the test structure due to the external wire for the non-floating gate electrode. In this case, the measured value of the subthreshold current in the test structure may differ from that in the actual cell. Consequently, it is difficult to correctly measure the coupling coefficient.

Even if the test structure can be created, there is a possibility of extracting a false value unless measuring conditions are optimized. Thus, the measuring conditions must be carefully set.

SUMMARY OF THE INVENTION

An object of the present invention is to provide a coupling coefficient measuring method for a semiconductor memory capable of directly measuring a coupling coefficient in an actual cell without employing a specific test structure including a non-floating gate structure or the like.

Another object of the present invention is to provide a coupling coefficient measuring method for a semiconductor memory capable of correctly measuring a coupling coefficient.

Still another object of the present invention is to provide a coupling coefficient measuring apparatus for a semiconductor memory capable of directly measuring a coupling coefficient in an actual cell without employing a specific test structure including a non-floating gate structure or the like.

According to a first aspect of the present invention, a coupling coefficient measuring method for a semiconductor memory having a first gate electrode and a source region coupled at a prescribed electrostatic coupling ratio comprises steps of increasing a source voltage while setting a drain voltage to a first drain voltage defining a reference value for measuring a first subthreshold current flowing through a first transistor having the first gate electrode as a gate, increasing the source voltage while setting the drain voltage to a second drain voltage higher by a prescribed value than the first drain voltage for measuring a second subthreshold current flowing through the first transistor, reading a first source voltage corresponding to a first value of the first subthreshold current and. a second source voltage corresponding to a second value of the second subthreshold current equal to the first value and calculating the ratio of the difference between the first drain voltage and the second drain voltage to the difference between the first source voltage and the second source voltage thereby obtaining the coupling coefficient between the first gate electrode and the source region.

The coupling coefficient measuring method according to the first aspect changes the drain voltage and increases the source voltage thereby measuring the first and second subthreshold currents and thereafter reads the first source voltage corresponding to the first value of the first subthreshold current and the second source voltage corresponding to the second value of the second subthreshold current equal to the first value while calculating the ratio of the difference between the first and second drain voltages to the difference between the first and second source voltages, whereby the coupling coefficient between the first gate electrode and the source region can be directly obtained in an actual cell without providing a specific test structure including a non-floating gate structure or the like, dissimilarly to the prior art.

In the aforementioned coupling coefficient measuring method for a semiconductor memory according to the first aspect, each of the steps of measuring the first subthreshold current and the second subthreshold current preferably includes steps of keeping the first transistor having the first gate electrode as the gate in an off state while a second transistor having a second gate electrode as a gate is on and thereafter increasing the source voltage thereby increasing the potential of the first gate electrode for turning on the first transistor while the second transistor is sufficiently on and measuring the first subthreshold current or the second subthreshold current flowing through the first transistor. Thus, when keeping the first transistor in an off state while the second transistor is on and thereafter increasing the potential of the first gate electrode for turning on the first transistor while the second transistor is sufficiently on and measuring the first or second subthreshold current, the second transistor is sufficiently on in measurement of the first and second subthreshold currents, whereby the characteristics of the second transistor can be prevented from influencing the first and second subthreshold currents.

In the aforementioned case, the step of keeping the first transistor in an off state while the second transistor is on preferably includes a step of injecting electrons into the first gate electrode thereby increasing the threshold voltage of the first transistor. According to this structure, the first transistor can be readily set off while the second transistor is on.

In the aforementioned case, the second gate voltage is preferably sufficiently higher than the threshold voltage of the second transistor when the first transistor is turned on. According to this structure, the second transistor is sufficiently on before the first transistor is turned on, whereby the characteristics of the second transistor can be effectively prevented from influencing the subthreshold current characteristics of the first transistor.

In the aforementioned case, each of the steps of measuring the first subthreshold current and the second subthreshold current preferably includes a step of increasing a voltage applied to the second gate electrode thereby previously measuring the voltage of the second gate electrode when the first transistor is turned on. According to this structure, the previously measured voltage of the second gate electrode may be simply applied when measuring the first and second subthreshold currents while values of voltages applied to elements other than the second gate electrode and the range of changing the voltages can be kept substantially constant even if the degree of increase of the threshold voltage of the first transistor is dispersed, whereby the measuring operation can be smoothly performed.

In the aforementioned coupling coefficient measuring method for a semiconductor memory according to the first aspect, the steps of measuring the first subthreshold current and measuring the second subthreshold current are preferably carried out while setting potential difference between the source voltage and the first drain voltage or the second drain voltage to allow no writing in the first gate electrode. According to this structure, no writing is performed in the first gate electrode when measuring the first and second subthreshold currents, whereby the measured values of the first and second subthreshold currents can be prevented from changing due to new writing. In this case, the potential difference between the source voltage and the first drain voltage or the second drain voltage is preferably not more than 3 V.

In the aforementioned coupling coefficient measuring method for a semiconductor memory according to the first aspect, the semiconductor memory may include a split gate flash memory.

According to a second aspect of the present invention, a coupling coefficient measuring method for a semiconductor memory having a first gate electrode and a second gate electrode coupled at a prescribed electrostatic coupling ratio comprises steps of increasing a voltage applied to the second gate electrode while setting a voltage applied to a source/drain region to a first voltage defining a reference value for measuring a first subthreshold current flowing through a first transistor having the first gate electrode as a gate, increasing the voltage applied to the second gate electrode while setting the voltage applied to the source/drain region to a second voltage higher by a prescribed value than the first voltage for measuring a second subthreshold current flowing through the first transistor, reading a third voltage of the second gate electrode corresponding to a first value of the first subthreshold current and a fourth voltage of the second gate electrode corresponding to a second value of the second subthreshold current equal to the first value and calculating the ratio of the difference between the first voltage and the second voltage of the source/drain region to the difference between the third voltage and the fourth voltage of the second gate electrode thereby obtaining the coupling coefficient between the first gate electrode and the second gate electrode.

The coupling coefficient measuring method for a semiconductor memory according to the second aspect changes the voltage applied to the source/drain region and increases the voltage of the second gate electrode thereby measuring the first and second subthreshold currents and thereafter reads the third voltage of the second gate electrode corresponding to the first value of the first subthreshold current and the fourth voltage of the second gate electrode corresponding to the second value of the second subthreshold current equal to the first value while calculating the ratio of the difference between the first voltage and the second voltage applied to the source/drain region to the difference between the third voltage and the fourth voltage of the second gate electrode, whereby the coupling coefficient between the first and second gate electrodes can be directly obtained in an actual cell without providing a specific test structure including a non-floating gate structure or the like, dissimilarly to the prior art.

In the aforementioned coupling coefficient measuring method for a semiconductor memory according to the second aspect, the semiconductor memory may include a stacked gate flash memory.

According to a third aspect of the present invention, a coupling coefficient measuring method for a semiconductor memory having a first gate electrode and a second gate electrode coupled at a prescribed electrostatic coupling ratio with the first gate electrode and the second gate electrode serially arranged between a source region and a drain region comprises steps of setting the maximum voltage of the second gate electrode smaller than a voltage obtained by adding the threshold voltage of a second transistor having the second gate electrode as a gate and a drain voltage in a data area employed as a correct measured value when applying a prescribed voltage to the second gate voltage in a prescribed memory cell thereby applying a voltage to the first gate electrode by electrostatic coupling and measuring a first subthreshold current between the source region and the drain region, directly applying a voltage to a test gate electrode in a test memory cell for measuring a second subthreshold current between the source region and the drain region and calculating the ratio between inclination of the first subthreshold current and inclination of the second subthreshold current thereby obtaining the coupling coefficient between the first gate electrode and the second gate electrode.

The coupling coefficient measuring method for a semiconductor memory according to the third aspect sets the maximum voltage of the second gate electrode smaller than the voltage obtained by adding the threshold voltage of the second transistor having the second gate electrode as the gate and the drain voltage when measuring the first subthreshold current in a prescribed actual memory cell as hereinabove described, whereby the drain region of the second transistor can be prevented from supplying electrons to the drain of the first transistor having the first gate electrode as the gate. Therefore, the drain of the first transistor is held in sufficiently low electron concentration. Thus, the first subthreshold current flowing through the first transistor can be measured substantially in a range reflecting only fluctuation of electron concentration on the source of the first transistor. Consequently, the subthreshold current characteristics of only the first transistor can be correctly evaluated. The coupling coefficient between the first and second gate electrodes can be correctly obtained by calculating the ratio between the inclination of the first subthreshold current measured in such a manner and inclination of the second subthreshold current measured by directly applying a voltage to the test gate electrode.

In the aforementioned coupling coefficient measuring method for a semiconductor memory according to the third aspect, the step of measuring the second subthreshold current in the test memory cell preferably includes a step of setting the maximum voltage of the second gate electrode smaller than a voltage obtained by adding the threshold voltage of the second transistor and the drain voltage when measuring the second subthreshold current in the test memory cell. According to this structure, the drain region of the second transistor can be prevented from supplying electrons to the drain of the first transistor in the test memory cell. Therefore, the drain of the first transistor is held in sufficiently low electron concentration. Thus, the first subthreshold current flowing through the first transistor can be measured substantially in a range reflecting only fluctuation of the electron concentration on the source of the first transistor. Consequently, the subthreshold current characteristics of only the first transistor can be correctly evaluated, whereby the second subthreshold current can be correctly measured.

In the aforementioned coupling coefficient measuring method for a semiconductor memory according to the third aspect, the test gate electrode may include a non-floating gate electrode. Further, the semiconductor memory may include a split gate flash memory.

According to a fourth aspect of the present invention, a coupling coefficient measuring apparatus for a semiconductor memory having a first gate electrode and a source region coupled at: a prescribed electrostatic coupling ratio comprises means increasing a source voltage while setting a drain voltage to a first drain voltage defining a reference value for measuring a first subthreshold current flowing through a first transistor having the first gate electrode as a gate, means increasing the source voltage while setting the drain voltage to a second drain voltage higher by a prescribed value than the first drain voltage for measuring a second subthreshold current flowing through the first transistor, means reading a first source voltage corresponding to a first value of the first subthreshold current and a second source voltage corresponding to a second value of the second subthreshold current equal to the first value, and means calculating the ratio of the difference between the first drain voltage and the second drain voltage to the difference between the first source voltage and the second source voltage thereby obtaining the coupling coefficient between the first gate electrode and the source region.

The coupling coefficient measuring apparatus for a semiconductor memory according to the fourth aspect changes the drain voltage and increases the source voltage thereby measuring the first and second subthreshold currents and thereafter reads the first source voltage corresponding to the first value of the first subthreshold current and the second source voltage corresponding to the second value of the second subthreshold current equal to the first value while calculating the ratio of the difference between the first and second drain voltages to the difference between the first and second source voltages, whereby the coupling coefficient between the first gate electrode and the source region can be directly obtained in an actual cell without providing a specific test structure including a non-floating gate structure or the like, dissimilarly to the prior art.

According to a fifth aspect of the present invention, a coupling coefficient measuring apparatus for a semiconductor memory having a first gate electrode and a second gate electrode coupled at a prescribed electrostatic coupling ratio comprises means increasing a voltage applied to the second gate electrode while setting a voltage applied to a source/drain region to a first voltage defining a reference value for measuring a first subthreshold current flowing through a first transistor having the first gate electrode as a gate, means increasing the voltage applied to the second gate electrode while setting the voltage applied to the source/drain region to a second voltage higher by a prescribed value than the first voltage for measuring a second subthreshold current flowing through the first transistor, means reading a third voltage of the second gate electrode corresponding to a first value of the first subthreshold current and a fourth voltage of the second gate electrode corresponding to a second value of the second subthreshold current equal to the first value, and means calculating the ratio of the difference between the first voltage and the second voltage of the source/drain region to the difference between the third voltage and the fourth voltage of the second gate electrode thereby obtaining the coupling coefficient between the first gate electrode and the second gate electrode.

The coupling coefficient measuring apparatus for a semiconductor memory according to the fifth aspect changes the voltage applied to the source/drain region and increases the voltage of the second gate electrode thereby measuring the first and second subthreshold currents and thereafter reads the third voltage of the second gate electrode corresponding to the first value of the first subthreshold current and the fourth voltage of the second gate electrode corresponding to the second value of the second subthreshold current equal to the first value while calculating the ratio of the difference between the first voltage and the second voltage of the source/drain region to the difference between the third voltage and the fourth voltage of the second gate electrode, whereby the coupling coefficient between the first and second gate electrodes can be obtained in an actual cell without providing a specific test structure including a non-floating gate structure or the like, dissimilarly to the prior art.

According to a sixth aspect of the present invention, a coupling coefficient measuring apparatus for a semiconductor memory having a first gate electrode and a second gate electrode coupled at a prescribed electrostatic coupling ratio with the first gate electrode and the second gate electrode serially arranged between a source region and a drain region comprises means setting the maximum voltage of the second gate electrode smaller than a voltage obtained by adding the threshold voltage of a second transistor having the second gate electrode as a gate and a drain voltage in a data area employed as a correct measured value when applying a prescribed voltage to the second gate voltage in a prescribed memory cell thereby applying a voltage to the first gate electrode by electrostatic coupling and measuring a first subthreshold current between the source region and the drain region, means directly applying a voltage to a test gate electrode in a test memory cell for measuring a second subthreshold current between the source region and the drain region, means measuring inclination of the first subthreshold current and inclination of the second subthreshold current, and means calculating the ratio between the inclination of the first subthreshold current and the inclination of the second subthreshold current thereby obtaining the coupling coefficient between the first gate electrode and the second gate electrode.

The coupling coefficient measuring apparatus for a semiconductor memory according to the sixth aspect sets the maximum voltage of the second gate electrode smaller than the voltage obtained by adding the threshold voltage of the second transistor having the second gate electrode as the gate and the drain voltage when measuring the first subthreshold current in a prescribed actual memory cell as hereinabove described, whereby the drain region of the second transistor can be prevented from supplying electrons to the drain of the first transistor having the first gate electrode as the gate. Therefore, the drain of the first transistor is held in sufficiently low electron concentration. Thus, the first subthreshold current flowing through the first transistor can be measured substantially in a range reflecting only fluctuation of electron concentration on the source of the first transistor. Consequently, the subthreshold current characteristics of only the first transistor can be correctly evaluated. The coupling coefficient between the first and second gate electrode can be correctly obtained by calculating the ratio between the inclination of the first subthreshold current measured in such a manner and inclination of the second subthreshold current measured by directly applying a voltage to the test gate electrode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
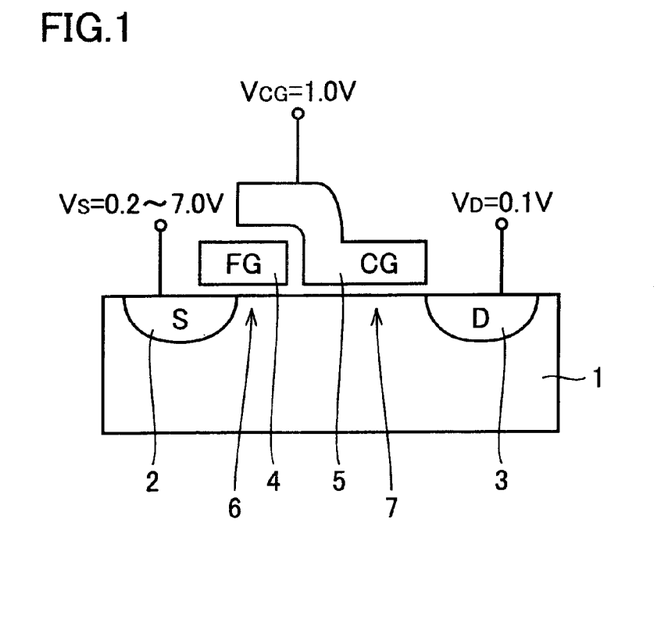
FIGS. 1 to 4 are sectional views for illustrating a coupling coefficient measuring method for a split gate flash memory according to a first embodiment of the present invention.

A coupling coefficient measuring method and a coupling coefficient measuring apparatus according to a first embodiment of the present invention are described with reference to FIGS. 1 to 6. With reference to the first embodiment, a method of measuring a coupling coefficient between a floating gate electrode and a source region in a split gate flash memory is described. In the structure of a memory cell of the split gate flash memory according to the first embodiment, a source region 2 and a drain region 3 are formed on the surface of a substrate 1 at a prescribed interval, as shown in FIG. 1. A floating gate electrode (FG) 4 and a control gate electrode (CG) 5 are serially arranged between the source region 2 and the drain region 3. The control gate electrode 5 is formed to partially overlap on the floating gate electrode 4. A floating gate transistor 6 is formed under the floating gate electrode 4, and a control gate transistor 7 is formed under the control gate electrode 5.

The floating gate electrode 4 is an example of the "first gate electrode" according to the present invention, and the control gate electrode 5 is an example of the "second gate electrode" according to the present invention. The floating gate transistor 6 is an example of the "first transistor" according to the present invention, and the control gate transistor 7 is an example of the "second transistor" according to the present invention.

Figure 5:
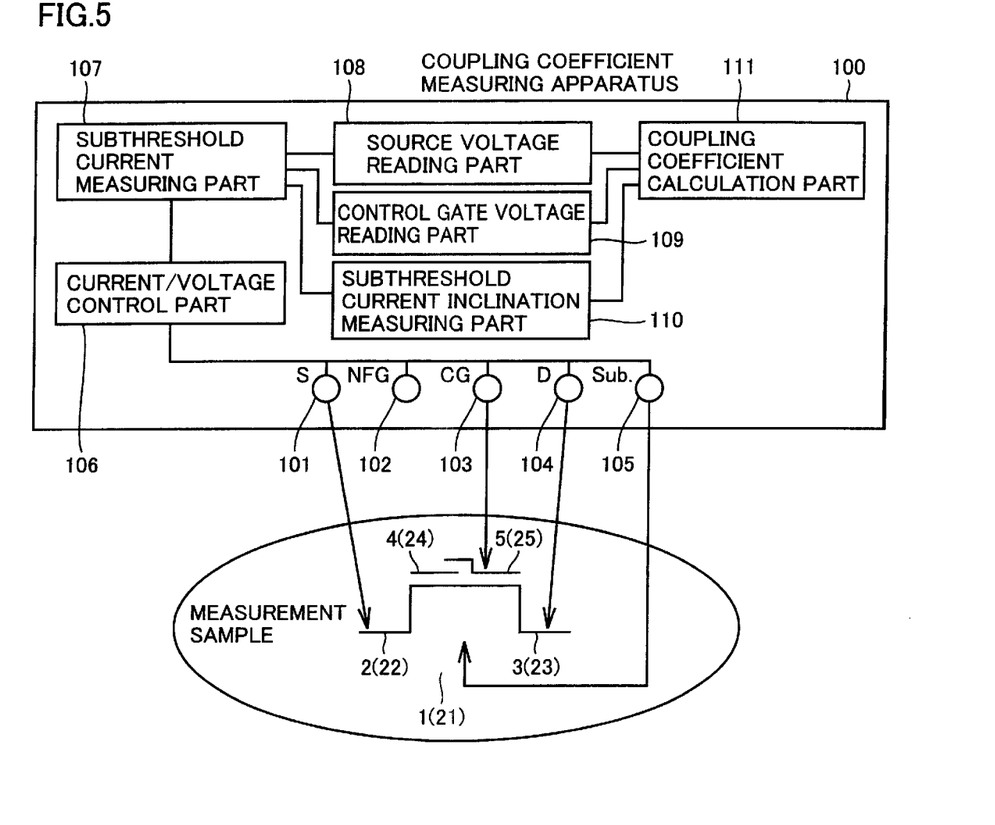
FIG. 5 schematically illustrates a coupling coefficient measuring apparatus and a measurement sample employed for the coupling coefficient measuring method for a split gate flash memory according to the first embodiment of the present invention.

A coupling coefficient measuring apparatus 100 employed for the coupling coefficient measuring method according to the first embodiment is now described with reference to FIG. 5. This coupling coefficient measuring apparatus 100 comprises terminals 101 to 105, a current/voltage control part 106, a subthreshold current measuring part 107, a source voltage reading part 108, a control gate voltage reading part 109, a subthreshold current inclination measuring part 110 and a coupling coefficient calculation part 111. The subthreshold current measuring part 107 is an example of the "means for measuring a first subthreshold current" and the "means for measuring a second subthreshold current" according to the present invention. The source voltage reading part 108 is an example of the "means reading a first source voltage and a second source voltage" according to the present invention. The coupling coefficient calculation part 111 is an example of the "means obtaining the coupling coefficient" according to the present invention.

The terminal 101 is connected to the source region 2. The terminal 102 is connected to a non-floating gate electrode (NFG) described later. The terminal 103 is connected to the control gate electrode (CG) 5, and the terminal 104 is connected to the drain region 3. The terminal 105 is connected to the substrate 1. The current/voltage control part 106 is connected to the terminals 101 to 105. The current/voltage control part 106 controls currents and voltages applied to the source region 2, the non-floating gate electrode (NFG), the control gate electrode (CG) 5, the drain region 3 and the substrate 1 through the terminals 101 to 105, while measuring the currents and the voltages of the source region 2, the non-floating gate electrode (NFG), the control gate electrode (CG) 5, the drain region 3 and the substrate 1. The subthreshold current measuring part 107 is connected to the current/voltage control part 106, for measuring a subthreshold current flowing in the source region 2.

The source voltage reading part 108 is connected to the subthreshold current measuring part 107, for measuring a source voltage for obtaining a prescribed subthreshold current on the basis of the subthreshold current measured by the subthreshold current measuring part 107. The control gate voltage reading part 109 is connected to the subthreshold current measuring part 107, for measuring a control gate voltage for obtaining the prescribed subthreshold current on the basis of the subthreshold current measured by the subthreshold current measuring part 107. The subthreshold current inclination measuring part 110 is connected to the subthreshold current measuring part 107, for measuring inclination of the subthreshold current on the basis of the subthreshold current measured by the subthreshold current measuring part 107. The coupling coefficient calculation part 111 is connected to the source voltage reading part 108, the control gate voltage reading part 109 or the subthreshold current inclination measuring part 110, for calculating the coupling coefficient on the basis of the result of measurement of the source voltage reading part 108, the control gate voltage reading part 109 or the subthreshold current inclination measuring part 110.

The terminal 104, the control gate voltage reading part 109 and the subthreshold current inclination measuring part 110 are not used in the first embodiment but employed in a third embodiment described later.

The aforementioned coupling coefficient measuring apparatus 100 is employed for measuring the coupling coefficient as follows:

In the coupling coefficient measuring method according to the first embodiment, weak writing is performed by injecting electrons into the floating gate electrode 4 for setting the floating gate transistor 6 on after sufficiently turning the control gate transistor 7 on in main measurement described later. If subjected to no writing, the floating gate electrode 4 is almost in an erased state and hence a current disadvantageously flows between the source region 2 and the drain region 3 following application of a threshold voltage (about 0.8 V) to the control gate transistor 7. Therefore, weak writing is performed on the floating gate electrode 4. In relation to this measurement of the coupling coefficient, an experiment was made under conditions of a drain voltage $V_D$ of 0.1 V, a control gate voltage $V_{CG}$ of 1.0 V and a source voltage $V_S$ of 0.2 to 7.0 V, as shown in FIG. 1. This weak write operation was repeated several times for confirming a stable point allowing neither new erasing nor new writing.

Figure 2:
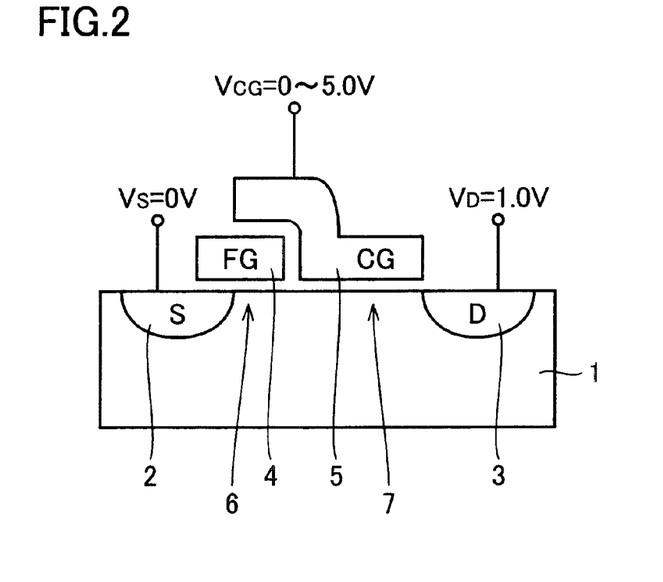

As shown in FIG. 2, the control gate voltage $V_{CG}$ is applied to the control gate electrode 5 for measuring the value of the control gate voltage $V_{CG}$ at the time when the floating gate transistor 6 is turned on. More specifically, the value of the control gate voltage $V_{CG}$ at the time when the floating gate transistor 6 is turned on is measured under conditions of the drain voltage $V_D$ of 1.0 V, the source voltage $V_S$ of 0 V and the control gate voltage $V_{CG}$ of 0 to 5.0 V. When a voltage is applied to the control gate electrode 5, the potential of the floating gate electrode 4 is pulled up due to coupling between the control gate electrode 5 and the floating gate electrode 4. When the potential of the floating gate electrode 4 reaches the threshold voltage of the floating gate transistor 6, the floating gate transistor 6 is turned on. When the floating gate transistor 6 is turned on, a current flows if a voltage is applied between the source region 2 and the drain region 3. In actual measurement under the aforementioned conditions, the value of the control gate voltage $V_{CG}$ for turning on the floating gate transistor 6 was 2.85 V.

A subthreshold current $I_S$ of the floating gate transistor 6 is used for measurement this time, and hence the value of the control gate voltage $V_{CG}$ for turning on the floating gate transistor 6 is preferably sufficiently higher than the threshold voltage of the control gate transistor 7. According to this structure, the control gate transistor 7 is sufficiently turned on before the floating gate transistor 6 is turned on, whereby the characteristics of the control gate transistor 7 can be effectively prevented from influencing the subthreshold current characteristics of the floating gate transistor 6.

Figure 3:
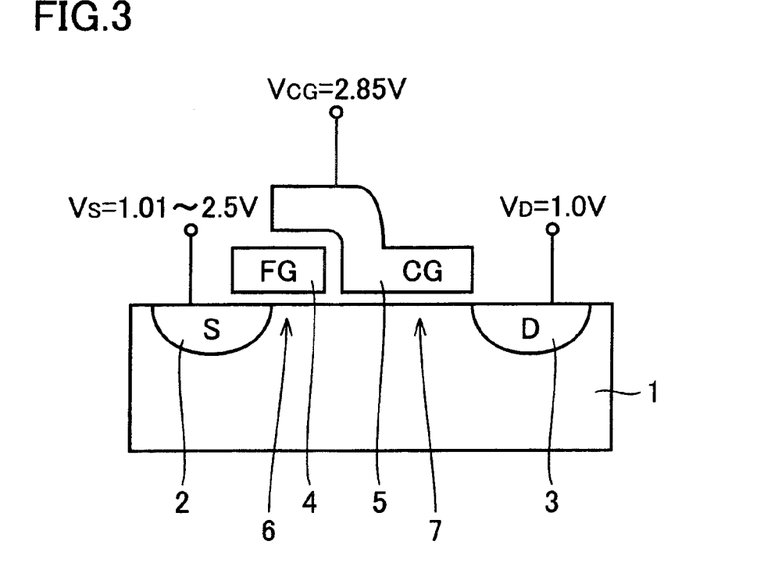
Figure 4:
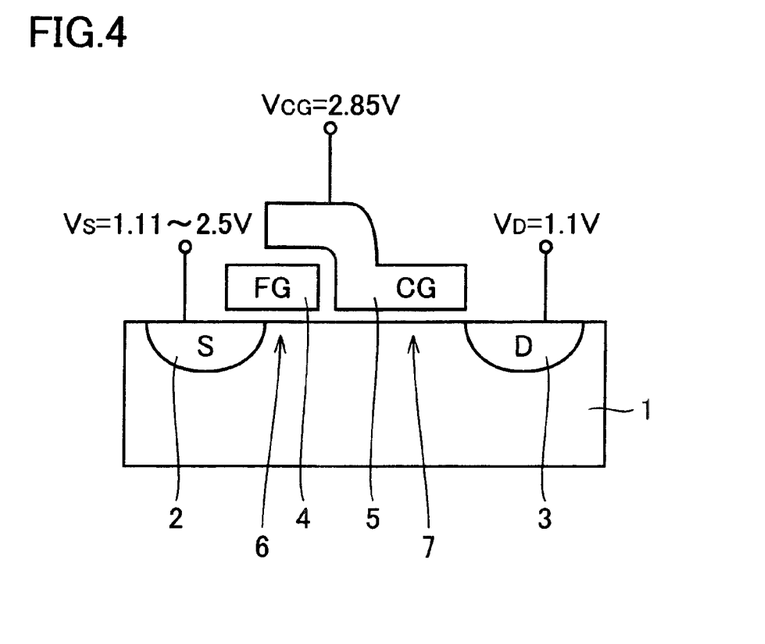

Then, the control gate voltage $V_{CG}$ (2.85 V) for turning on the floating gate transistor 6 measured by the aforementioned method is applied to the control gate electrode 5 while increasing the source voltage $V_S$ as shown in FIGS. 3 and 4, thereby measuring the subthreshold current $I_S$ of the floating gate transistor 6. More specifically, conditions for sufficiently turning on the control gate transistor 7 and starting turning on the floating gate transistor 6 have been proved by the aforementioned measurement. With reference to these conditions, the source voltage $V_S$ is first applied to the source region 2 so that the control gate transistor 7 is on while the floating gate transistor 6 is off when a current flows from the source region 2 to the drain region 3 (electrons flow from the drain region 3 to the source region 2). From this state, the source voltage $V_S$ is increased for sufficiently turning on the control gate transistor 7 while turning on the floating gate transistor 6, and the subthreshold current $I_S$ of the floating gate transistor 6 is measured. Further, the drain voltage $V_D$ is increased by 0.1 V for performing similar measurement.

More in detail, the source voltage $V_S$ is increased under conditions of the drain voltage $V_D$ of 1.0 V, the control gate voltage $V_{CG}$ of 2.85 V and the source voltage $V_S$ of 1.01 to 2.5 V as shown in FIG. 3, for turning on the floating gate transistor 6 and measuring the subthreshold current $I_S$ of the floating gate transistor 6. Then, the drain voltage $V_D$ is increased by 0.1 V to reach 1.1 V and the source voltage $V_S$ is increased under conditions of the control gate voltage $V_{CG}$ of 2.85 V and the source voltage $V_S$ of 1.11 to 2.5 V as shown in FIG. 4, for measuring the subthreshold current $I_S$ of the floating gate transistor 6.

Figure 6:
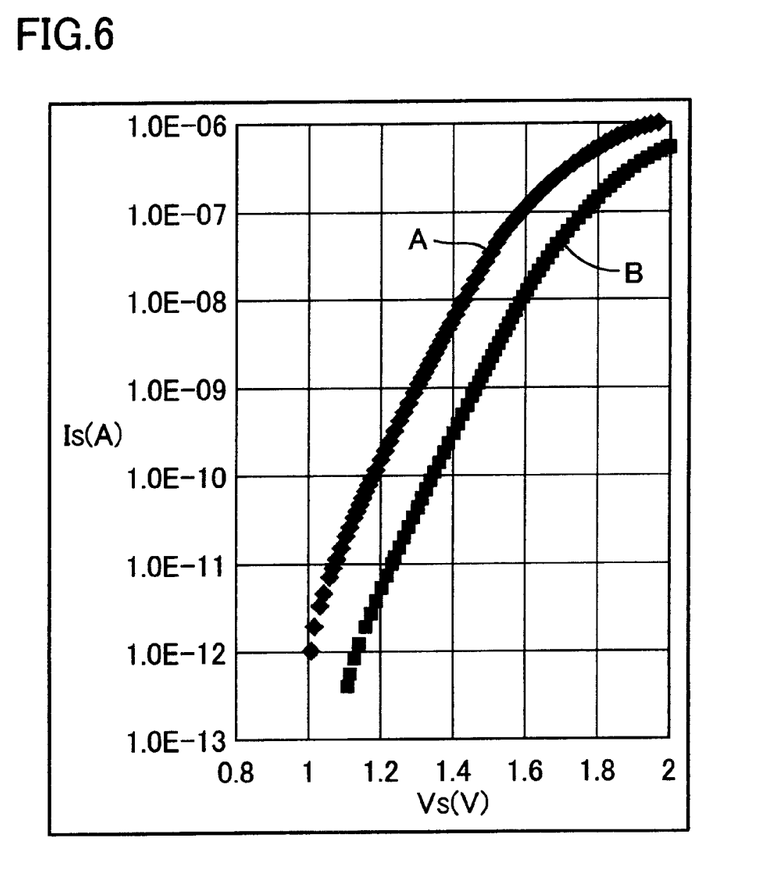
FIG. 6 is a correlation diagram showing the relation between a source voltage and a subthreshold current (source current) according to the first embodiment of the present invention.

FIG. 6 shows the relation between the source voltage $V_S$ and the subthreshold current $I_S$ measured under the aforementioned conditions. Referring to FIG. 6, lines A and B plot results of measurement under the conditions shown in FIGS. 3 and 4 respectively.

Linear parts of the semi-logarithmic plots shown in FIG. 6 were regarded as the subthreshold currents, for reading a voltage bringing the lines A and B to 1.0 E-10 A (0.1 nA). In the portions of 1.0 E-10 A (0.1 nA), the lines A and B are straight and can be regarded as the subthreshold currents. The values of the source voltage $V_S$ setting the subthreshold currents to 1.0 E-10 A (0.1 nA) were 1.183 V and 1.349 V on the lines A and B respectively. In the portions where the lines A and B are straight, a current value other than 1.0 E-10 A (0.1 nA) may be employed for reading the values of the source voltage $V_S$ corresponding thereto. In this case, a small current value is preferably employed for reducing errors.

According to the first embodiment, it is assumed that the same subthreshold current flows when the difference $V_{FD}$ between the potentials of the floating gate electrode 4 and the drain region 3 is identical. Consider how much the source voltage $V_S$ must be increased for increasing the voltage of the floating gate electrode 4 by 0.1 V when increasing the drain voltage $V_D$ by 0.1 V on the basis of this assumption. More specifically, the source voltage $V_S$ must be increased by 0.2 V for increasing the voltage of the floating gate electrode 4 by 0.1 V if the coupling coefficient is 0.5. From this point of view, the increment of the drain voltage $V_D$ with respect to the difference of the source voltage $V_S$ is calculated for obtaining the coupling coefficient ($C_{FS}$) between the source region 2 and the floating gate electrode 4 in the first embodiment.

According to the aforementioned idea, the coupling coefficient ($C_{FS}$) between the source region 2 and the floating gate electrode 4 is obtained as follows:

$C_{FS}$=increment of drain voltage $V_D$/difference of source voltage
$V_S$=0.1/(1.349−1.183)=0.602

As hereinabove described, the coupling coefficient ($C_{FS}$) between the source region 2 and the floating gate electrode 4 obtained by the method according to the first embodiment was 0.602.

According to the first embodiment, as hereinabove described, the coupling coefficient ($C_{FS}$) between the floating gate electrode 4 and the source region 2 can be directly obtained in an actual cell without providing a specific test structure including a non-floating gate structure or the like, dissimilarly to the prior art.

While the subthreshold current of the same electron flow direction as the write operation is measured in the first embodiment, the potential difference between the source region 2 and the drain region 3 is not more than 3 V and hence no writing is performed on the floating gate electrode 4 at the source voltage $V_S$. Thus, the measured value of the subthreshold current is not changed by new writing.

Second Embodiment

A coupling coefficient measuring apparatus 100 employed for a coupling coefficient measuring method according to a second embodiment of the present invention is identical in structure to the coupling coefficient measuring apparatus 100 employed for the coupling coefficient measuring method according to the first embodiment. However, the second embodiment uses not the source voltage reading part 108 employed in the first embodiment but a control gate voltage reading part 109. The control gate voltage reading part 109 is an example of the "means reading third and fourth voltages of the second gate electrode" according to the present invention.

Figure 7:
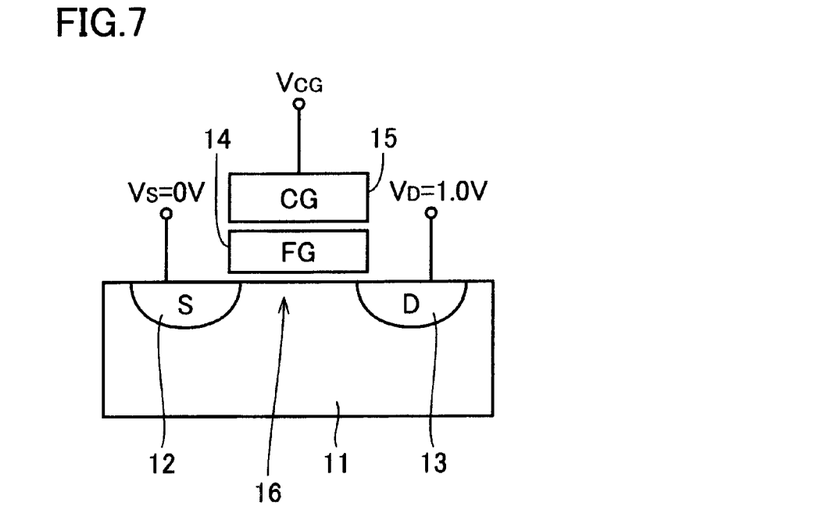
FIGS. 7 and 8 are sectional views for illustrating a coupling coefficient measuring method for a stacked gate flash memory according to a second embodiment of the present invention.
Figure 8:
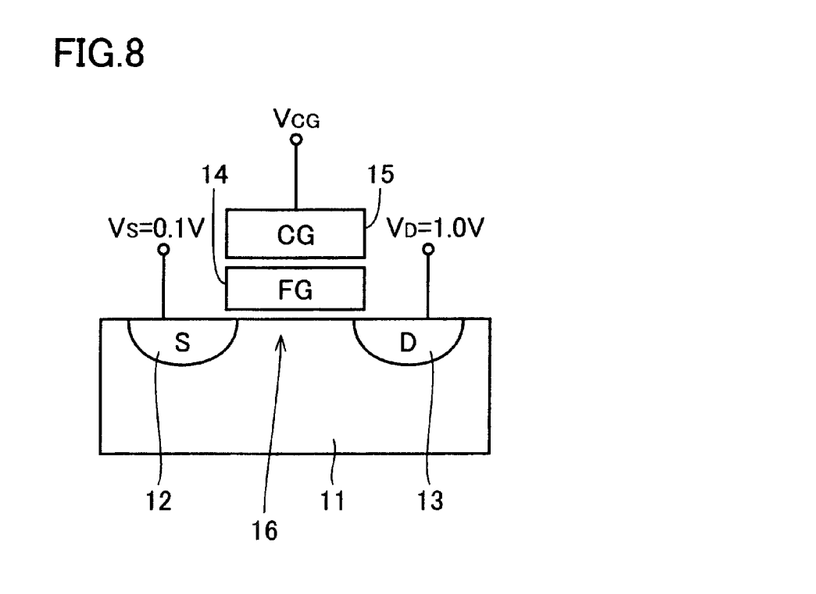
Figure 9:
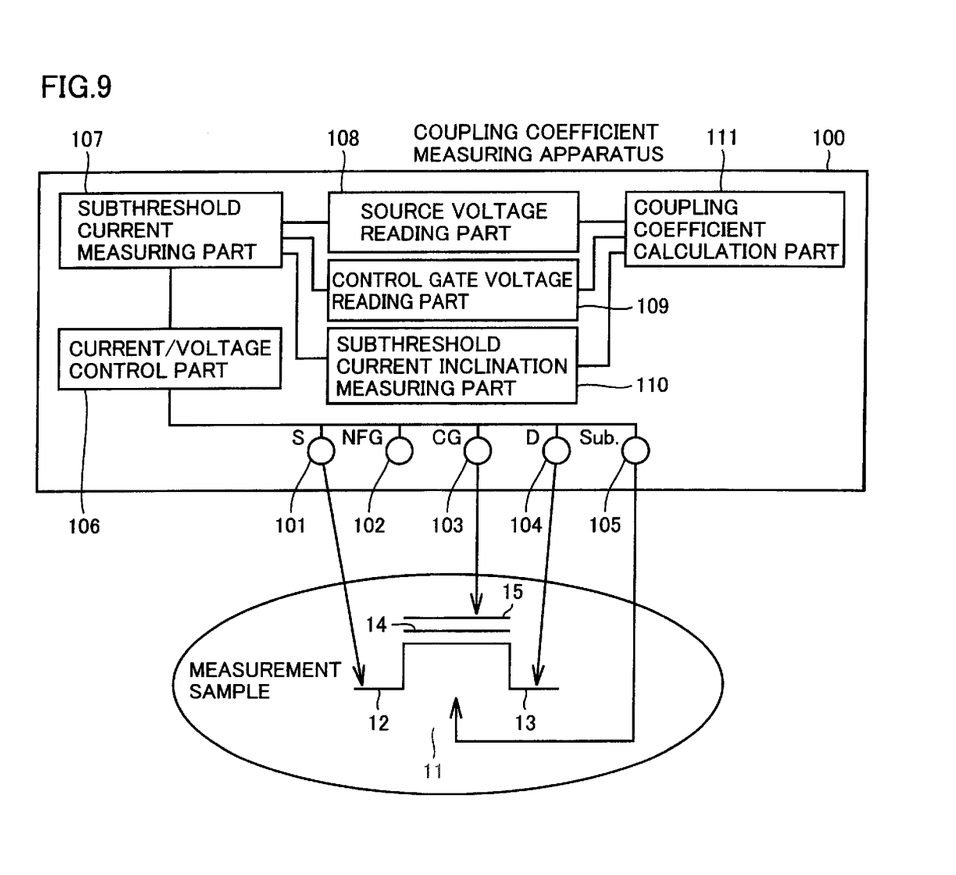
FIG. 9 schematically illustrates a coupling coefficient measuring apparatus and a measurement sample employed for the coupling coefficient measuring method for a stacked gate flash memory according to the second embodiment of the present invention.

Referring to FIGS. 7 to 9, the second embodiment of the present invention is described with reference to a method of measuring a coupling coefficient between a floating gate electrode 14 and a control gate electrode 15 in a stacked gate flash memory with the coupling coefficient measuring apparatus 100 and a measurement sample shown in FIG. 9. In the stacked gate flash memory, a source region 12 and a drain region 13 are formed on the surface of a substrate 11 at a prescribed interval, as shown in FIG. 7. The floating gate electrode (FG) 14 is formed on a portion of the substrate 11 located between the source region 12 and the drain region 13, and the control gate electrode (CG) 15 is formed on the floating gate electrode 14. A floating gate transistor 16 is formed under the floating gate electrode 14.

The source region 12 and the drain region 13 are examples of the "source/drain region" according to the present invention. The floating gate electrode 14 is an example of the "first gate electrode" according to the present invention, and the control gate electrode 15 is an example of the "second gate electrode" according to the present invention. The floating gate transistor 16 is an example of the "first transistor" according to the present invention.

According to the second embodiment, a control gate voltage $V_{CG}$ is first increased while applying a source voltage $V_S$ of 0 V and a drain voltage $V_D$ of 1.0 V, as shown in FIG. 7. Thus, the floating gate electrode 16 is turned on for measuring a subthreshold current I.

Then, the control gate voltage $V_{CG}$ is increased while increasing the source voltage $V_S$ by 0.1 V from 0 V, as shown in FIG. 8. Thus, the floating gate transistor 16 is turned on for measuring the subthreshold current I.

A graph similar to that according to the aforementioned first embodiment shown in FIG. 6 is prepared, for thereafter reading values of the control gate voltage $V_{CG}$ under conditions of the source voltage $V_S$ of 0 V and 0.1 V and the subthreshold current I of 1 nA and 1 nA shown in FIGS. 7 and 8 respectively. The coupling coefficient ($C_{FC}$) between the floating gate electrode 14 and the control gate electrode 15 can be obtained by calculating the ratio of the voltage difference (0.1 V) of the source voltage $V_S$ to the voltage difference of the control gate voltage $V_{CG}$.

Thus, according to the second embodiment, the coupling coefficient ($C_{FC}$) between the floating gate electrode 14 and the control gate electrode 15 can be directly measured in an actual cell of a stacked gate flash memory without employing a test structure including a non-floating gate structure or the like, dissimilarly to the prior art.

In the stacked gate flash memory according to the second embodiment, the floating gate transistor 16 and a control gate transistor are not serially arranged between the source region 12 and the drain region 13 dissimilarly to the aforementioned split gate flash memory according to the first embodiment, and hence no write operation may be performed dissimilarly to the aforementioned first embodiment.

In the stacked gate flash memory according to the second embodiment, further, the source region 12 and the drain region 13 are symmetrical about the floating gate electrode 14, whereby similar measurement can be performed also when the source voltage $V_S$ and the drain voltage $V_D$ applied to the source region 12 and the drain region 13 are replaced with each other. In other words, the coupling coefficient can be measured similarly to the above also when applying 1.0 V as the source voltage $V_S$ while applying 0 V and 0.1 V as the drain voltage $V_D$.

Third Embodiment

A third embodiment of the present invention is described with reference to a method of more correctly measuring a coupling coefficient than the prior art through a conventional test structure including a non-floating gate electrode, dissimilarly to the aforementioned first and second embodiments. A coupling coefficient measuring apparatus 100 employed for the coupling coefficient measuring method according to the third embodiment is identical in structure to the coupling coefficient measuring apparatus 100 employed for the coupling coefficient measuring method according to the first embodiment. However, the coupling coefficient measuring apparatus 100 according to the third embodiment uses not the source voltage reading part 108 and the control gate voltage reading part 109 employed in the first and second embodiments respectively but a subthreshold current inclination measuring part 110. The subthreshold current inclination measuring part 110 is an example of the "means measuring inclination of the first subthreshold current and inclination of the second subthreshold current" according to the present invention. The method of measuring a coupling coefficient between a floating gate electrode 24 and a control gate electrode 25 according to the third embodiment is now described with reference to FIGS. 10 to 14.

Figure 10:
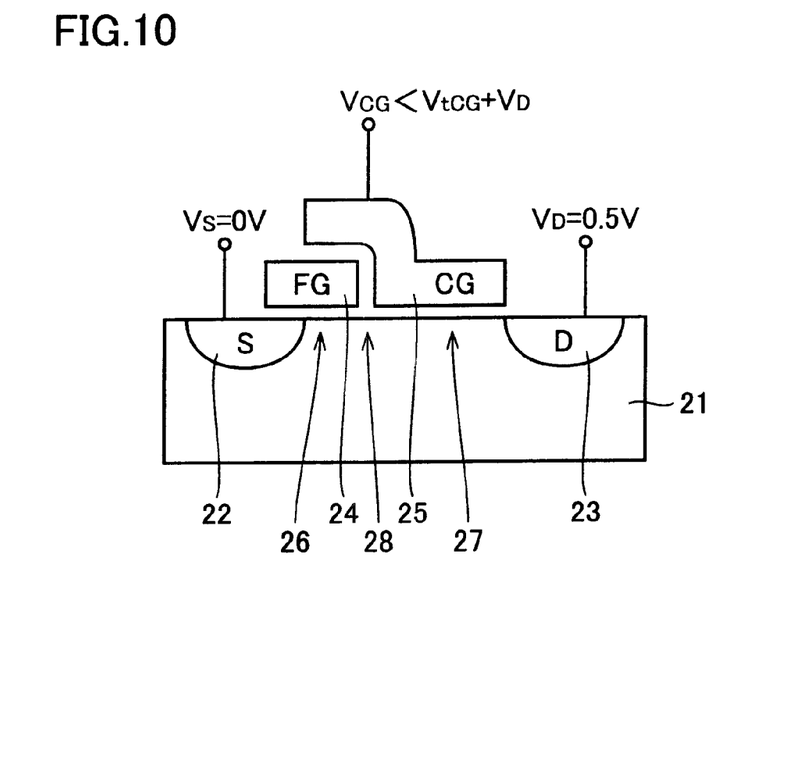
FIG. 10 is a sectional view for illustrating a coupling coefficient measuring method for a split gate flash memory according to a third embodiment of the present invention.

In a memory cell of a split gate flash memory according to the third embodiment, a source region 22 and a drain region 23 are formed on the surface of a substrate 21 at a prescribed interval. The floating gate electrode 24 and the control gate electrode 25 are serially arranged between the source region 22 and the drain region 23. The control gate electrode 25 is formed to partially overlap on the floating gate electrode 24. A floating gate transistor 26 is formed under the floating gate electrode 24, and a control gate transistor 27 is formed under the control gate electrode 25.

The floating gate electrode 24 is an example of the "first gate electrode" according to the present invention, and the control gate electrode 25 is an example of the "second gate electrode" according to the present invention. The floating gate transistor 26 is an example of the "first transistor" according to the present invention, and the control gate transistor 27 is an example of the "second transistor" according to the present invention.

According to the third embodiment, the coupling coefficient between the floating gate electrode 24 and the control gate electrode 25 is obtained by calculating the ratio between inclination (S value) of a subthreshold current measured in an actual cell of the split gate flash memory and inclination (S value) of a subthreshold current measured in the test structure including a non-floating gate electrode. This method is now described in detail.

The method of measuring the subthreshold current in the actual cell is described with reference to FIGS. 10 and 11. In this case, a control gate voltage $V_{CG}$ is increased under conditions of a source voltage $V_S$ of 0 V and a drain voltage $V_D$ of 0.5 V for increasing the voltage of the floating gate electrode 24 by electrostatic coupling, thereby turning on the floating gate transistor 26 and the control gate transistor 27 and measuring the subthreshold current $I_D$. In this case, the voltages are applied through terminals 101 and 103 to 105 other than a terminal 102, similarly to the first embodiment shown in FIG. 5.

According to the third embodiment, the control gate voltage $V_{CG}$ is set in the following range (1) for measuring the subthreshold current $I_D$ of the actual cell:

$$V_{CG} < V_{tCG} + V_D \quad (1)$$

Referring to the above formula (1), the maximum value of the control gate voltage $V_{CG}$ is set smaller than a value obtained by adding the threshold voltage $V_{tCG}$ of the control gate transistor 27 and the drain voltage $V_D$ for the following reason: If the control gate voltage $V_{CG}$ exceeds the value obtained by adding the threshold voltage $V_{tCG}$ of the control gate transistor 27 and the drain voltage $V_D$, the surface potential in the portion of the substrate 21 located under the control gate electrode 25 matches with the drain region 23. Thus, electrons stored in the drain region 23 are supplied to a region 28 closer to the floating gate electrode 24 while the quantity of the electrons supplied to the region 24 is increased as the control gate voltage $V_{CG}$ is increased, whereby the subthreshold current $I_D$ which is a diffusion current responsive to electron concentration difference is not decided by only the concentration of electrons supplied to a source end of the floating gate transistor 26 from the source region 22. Therefore, it is difficult to correctly measure the subthreshold current $I_D$. In other words, the concentration of electrons supplied from the drain region 23 to the region 28 influences the subthreshold current $I_D$ if the control gate voltage $V_{CG}$ exceeds the value obtained by adding the threshold voltage $V_{tCG}$ of the control gate transistor 27 and the drain voltage $V_D$ to cause difficulty in correct measurement.

Figure 11:
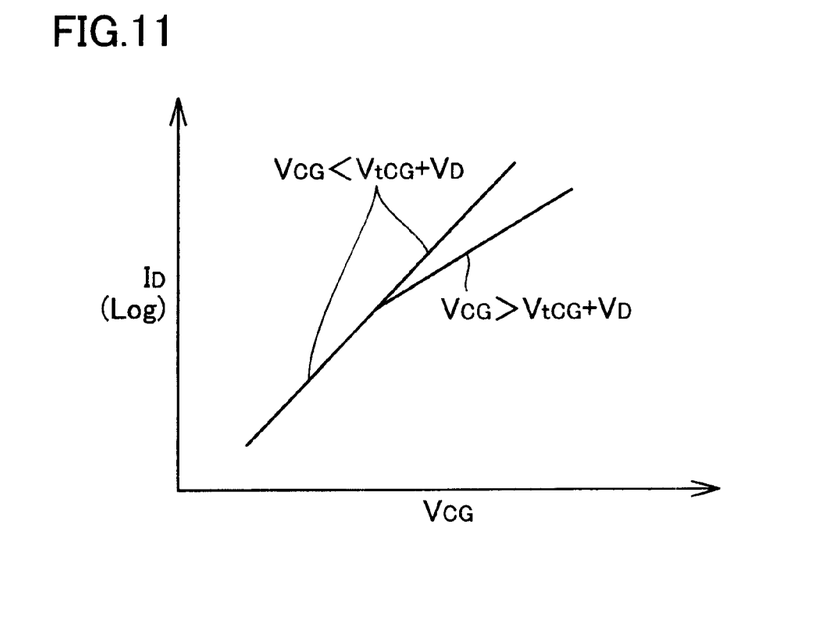
FIG. 11 is a conceptual diagram for illustrating the relation between a control gate voltage and a subthreshold current (drain current) in the embodiment shown in FIG. 10.

More specifically, it is understood from FIG. 11 that the inclination of the subthreshold current $I_D$ is reduced when the control gate voltage $V_{CG}$ exceeds the value obtained by adding the threshold voltage $V_{tCG}$ of the control gate transistor 27 and the drain voltage $V_D$. In other words, it is understood that the subthreshold current $I_D$ is reduced when the control gate voltage $V_{CG}$ exceeds the value obtained by adding the threshold voltage $V_{tCG}$ of the control gate transistor 27 and the drain voltage $V_D$ due to influence by the concentration of the electrons supplied from the drain region 23 to the region 28.

In consideration of this point, the control gate voltage $V_{CG}$ is set in the range of the above formula (1) when measuring the subthreshold current $I_D$ of the actual cell.

Thus, the subthreshold current $I_D$ is decided only by the concentration of electrons supplied to the source end of the floating gate transistor 26 from the source region 22 with no influence by the concentration, substantially zero, of electrons supplied from the drain region 23 to the region 28 on the drain end of the floating gate transistor 26, whereby the subthreshold current $I_D$ can be correctly measured.

Figure 12:
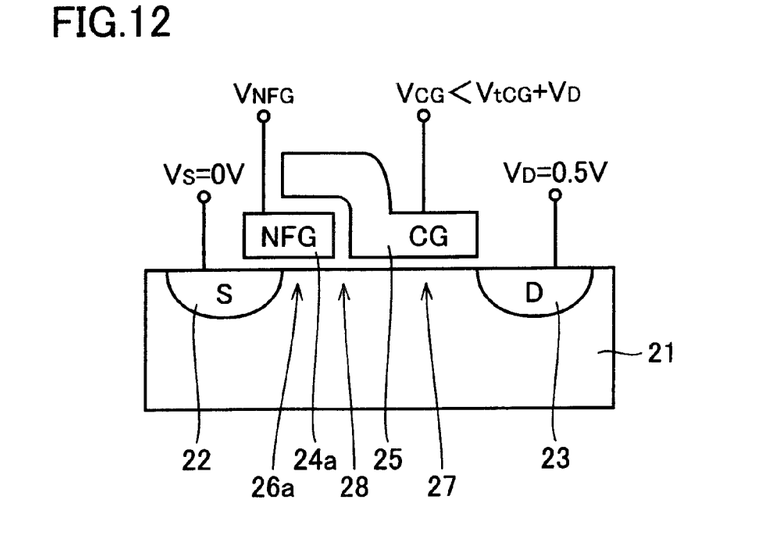
FIG. 12 is a sectional view for illustrating a coupling coefficient measuring method for a split gate flash memory employing a non-floating gate electrode according to the third embodiment of the present invention.
Figure 13:
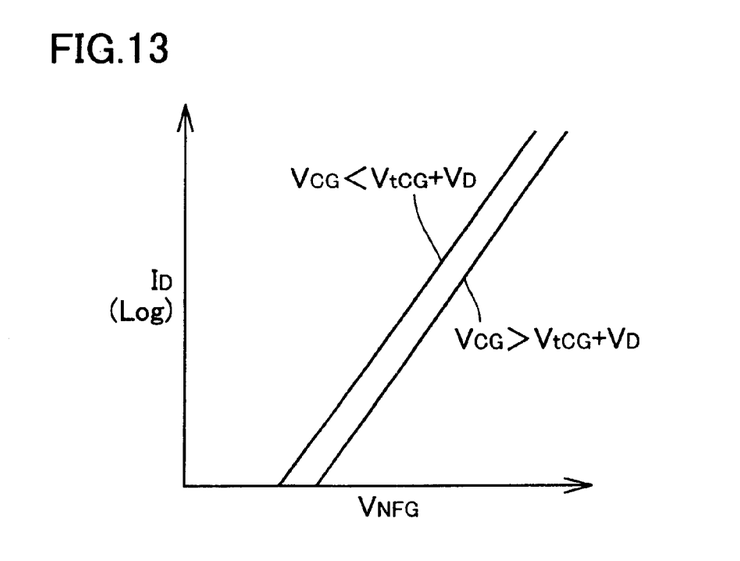
FIG. 13 is a conceptual diagram showing the relation between a non-floating gate voltage and a subthreshold current (drain current) in the embodiment shown in FIG. 12.
Figure 14:
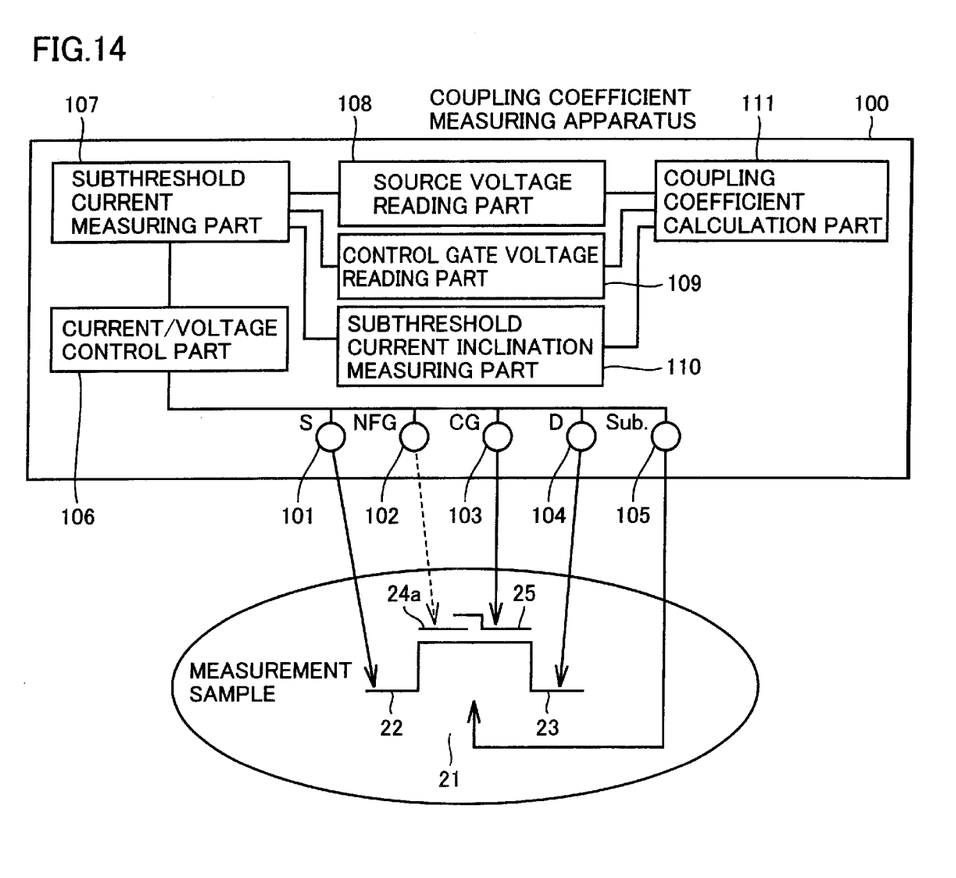
FIG. 14 schematically illustrates a coupling coefficient measuring apparatus and a measurement sample employed for the coupling coefficient measuring method according to the third embodiment of the present invention.

After the subthreshold current $I_D$ is measured in the actual cell as described above, the subthreshold current $I_D$ is measured in a test structure including a non-floating gate electrode 24a, as shown in FIGS. 12 and 13. In this case, the terminal 104 for applying a voltage to the non-floating gate electrode (NFG) 24a is also employed, as shown in FIG. 14. More specifically, the control gate voltage $V_{CG}$ is set smaller than the value obtained by adding the threshold voltage $V_{tCG}$ of the control gate transistor 27 and the drain voltage $V_D$ under conditions of the source voltage $V_S$ of 0 V and the drain voltage $V_D$ of 0.5 V, as shown in FIG. 12. In this state, the control gate transistor 27 is on while a non-floating gate transistor 26a is off. When a non-floating gate voltage $V_{NFG}$ is increased from this state, the control gate transistor 27 remains on while the non-floating gate transistor 26a starts to be turned on. The subthreshold current $I_D$ is measured in this state. The non-floating gate electrode 24a is an example of the "test gate electrode" according to the present invention.

FIG. 13 shows the relation between the measured subthreshold current $I_D$ and the non-floating gate voltage $V_{NFG}$. Referring to FIG. 13, it is understood that the subthreshold current $I_D$ measured while setting the control gate voltage $V_{CG}$ larger than the value obtained by adding the threshold voltage $V_{tCG}$ of the control gate transistor 27 and the drain voltage $V_D$ is reduced as compared with the subthreshold current $I_D$ measured while setting the control gate voltage $V_{CG}$ smaller than the value obtained by adding the threshold voltage $V_{tCG}$ of the control gate transistor 27 and the drain voltage $V_D$.

The reason for this is as follows: When the control gate voltage $V_{CG}$ is greater than the value obtained by adding the threshold voltage $V_{tCG}$ of the control gate transistor 27 and the drain voltage $V_D$ ($V_{CG}>V_{tCG}+V_D$), the potential of the control gate electrode 25 is lower than that of the drain region 23, and hence electrons in the drain region 23 are supplied to the non-floating gate electrode 24a, to increase the electron concentration in the region 28. Therefore, the quantity of the subthreshold current $I_D$ responsive to the difference between the concentration of electrons supplied from the source region 22 to a source end of the non-floating gate transistor 26a and the electron concentration of the region 28 is reduced. In this case, the subthreshold current $I_D$ is not decided by only the concentration of the electrons supplied from the source region 22 to the source end of the non-floating gate transistor 26a, and hence it is difficult to correctly measure the subthreshold current $I_D$. However, the electron concentration on the drain end region 28 of the non-floating gate electrode 24a remains unchanged and the inclination of the subthreshold current $I_D$ is correct during the measurement.

In consideration of this point, the control gate voltage $V_{CG}$ is set smaller than the value obtained by adding the threshold voltage $V_{tCG}$ of the control gate transistor 27 and the drain voltage $V_D$ when measuring the subthreshold current $I_D$ in the test structure including the non-floating gate electrode 24a in the third embodiment, whereby the potential of the control gate electrode 25 can be prevented from being lower than that of the drain region 23. Thus, electrons in the drain region 23 can be prevented from being supplied to the region 28, whereby the subthreshold current $I_D$ flowing through the non-floating gate transistor 26a is decided by only the concentration of the electrons supplied from the source region 22 to the source end of the non-floating gate transistor 26a. Consequently, the subthreshold current $I_D$ can be correctly measured.

The coupling coefficient between the floating gate electrode 24 and the control gate electrode 25 can be more correctly obtained by obtaining the ratio between the inclination (S value) of the subthreshold current $I_D$ in the actual cell and that of the test structure measured by the aforementioned method.

If only the coupling coefficient is to be obtained through the inclination of the subthreshold current $I_D$, the maximum voltage of the control gate electrode 25 in the aforementioned measurement of the subthreshold current $I_D$ is not subjected to the aforementioned limitation ($V_{CG}<V_{tCG}+V_D$) so far as the same sufficiently exceeds the threshold voltage $V_{tCG}$ of the control gate transistor 27.

Although the present invention has been described and illustrated in detail, it is clearly understood that the same is by way of illustration and example only and is not to be taken by way of limitation, the spirit and scope of the present invention being limited only by the terms of the appended claims.

For example, while each of the aforementioned embodiments is applied to a flash memory, the present invention is not restricted to this but is also applicable to a semiconductor memory, other than the flash memory, having a similar memory cell structure.

What is claimed is:

1. A coupling coefficient measuring method for a semiconductor memory having a first gate electrode and a source region coupled at a prescribed electrostatic coupling ratio, comprising steps of:

increasing a source; voltage while setting a drain voltage to a first drain, voltage defining a reference value for measuring a first subthreshold current flowing through a first transistor having said first gate electrode as a gate;

increasing said source voltage while setting said drain voltage to a second drain voltage higher by a prescribed value than said first drain voltage for measuring a second subthreshold current flowing through said first transistor;

reading a first source voltage corresponding to a first value of said first subthreshold current and a second source voltage corresponding to a second value of said second subthreshold current equal to said first value; and calculating the ratio of the difference between said first drain voltage and said second drain voltage to the difference between said first source voltage and said second source voltage thereby obtaining the coupling coefficient between said first gate electrode and said source region.

2. The coupling coefficient measuring method for a semiconductor memory according to claim 1, wherein each of said steps of measuring said first subthreshold current and said second subthreshold current includes steps of:

keeping said first transistor in an off state while a second transistor having a second gate electrode as a gate is on; and thereafter increasing said source voltage thereby increasing the potential of said first gate electrode for turning on said first transistor while said second transistor is sufficiently on and measuring said first subthreshold current or said second subthreshold current flowing through said first transistor.

3. The coupling coefficient measuring method for a semiconductor memory according to claim 2, wherein said step of keeping said first transistor in an off state while said second transistor is on includes a step of injecting electrons into said first gate electrode thereby increasing the threshold voltage of said first transistor.

4. The coupling coefficient measuring method for a semiconductor memory according to claim 2, wherein said second gate voltage is sufficiently higher than the threshold voltage of said second transistor when said first transistor is turned on.

5. The coupling coefficient measuring method for a semiconductor memory according to claim 2, wherein each of said steps of measuring said first subthreshold current and said second subthreshold current includes a step of increasing a voltage applied to said second gate electrode thereby previously measuring the voltage of said second gate electrode when said first transistor is turned on.

6. The coupling coefficient measuring method for a semiconductor memory according to claim 1, wherein said steps of measuring said first subthreshold current and measuring said second subthreshold current are carried out while setting potential difference between said source voltage and said first drain voltage or said second drain voltage to allow no writing in said first gate electrode.

7. The coupling coefficient measuring method for a semiconductor memory according to claim 6, wherein said potential difference between said source voltage and said first drain voltage or said second drain voltage is not more than 3 V.

8. The coupling coefficient measuring method for a semiconductor memory according to claim 1, wherein said semiconductor memory includes a split gate flash memory.

9. A coupling coefficient measuring method for a semiconductor memory having a first gate electrode and a second gate electrode coupled at a prescribed electrostatic coupling ratio, comprising steps of:

increasing a voltage applied to said second gate electrode while setting a voltage applied to a source/drain region to a first voltage defining a reference value for measuring a first subthreshold current flowing through a first transistor having said first gate electrode as a gate;

increasing said voltage applied to said second gate electrode while setting said voltage applied to said source/drain region to a second voltage higher by a prescribed value than said first voltage for measuring a second subthreshold current flowing through said first transistor;

reading a third voltage of said second gate electrode corresponding to a first value of said first subthreshold current and a fourth voltage of said second gate electrode corresponding to a second value of said second subthreshold current equal to said first value; and calculating the ratio of the difference between said first voltage and said second voltage of said source/drain region to the difference between said third voltage and said fourth voltage of said second gate electrode thereby obtaining the coupling coefficient between said first gate electrode and said second gate electrode.

10. The coupling coefficient measuring method for a semiconductor memory according to claim 9, wherein said semiconductor memory includes a stacked gate flash memory.

11. A coupling coefficient measuring method for a semiconductor memory having a first gate electrode and a second gate electrode coupled at a prescribed electrostatic coupling ratio with said first gate electrode and said second gate electrode serially arranged between a source region and a drain region, comprising steps of:

setting the maximum voltage of said second gate electrode smaller than a voltage obtained by adding the threshold voltage of a second transistor having said second gate electrode as a gate and a drain voltage in a data area employed as a correct measured value when applying a prescribed voltage to said second gate voltage in a prescribed memory cell thereby applying a voltage to said first gate electrode by electrostatic coupling and measuring a first subthreshold current between said source region and said drain region;

directly applying a voltage to a test gate electrode in a test memory cell for measuring a second subthreshold current between said source region and said drain region; and calculating the ratio between inclination of said first subthreshold current and inclination of said second subthreshold current thereby obtaining the coupling coefficient between said first gate electrode and said second gate electrode.

12. The coupling coefficient measuring method for a semiconductor memory according to claim 11, wherein said step of measuring said second subthreshold current in said test memory cell includes a step of setting the maximum voltage of said second gate electrode smaller than a voltage obtained by adding the threshold voltage of said second transistor and a drain voltage when measuring said second subthreshold current in said test memory cell.

13. The coupling coefficient measuring method for a semiconductor memory according to claim 11, wherein said test gate electrode includes a non-floating gate electrode.

14. The coupling coefficient measuring method for a semiconductor memory according to claim 11, wherein said semiconductor memory includes a split gate flash memory.

15. A coupling coefficient measuring apparatus for a semiconductor memory having a first gate electrode and a source region coupled at a prescribed electrostatic coupling ratio, comprising:

means increasing a source voltage while setting a drain voltage to a first drain voltage defining a reference value for measuring a first subthreshold current flowing through a first transistor having said first gate electrode as a gate;

means increasing said source voltage while setting said drain voltage to a second drain voltage higher by a prescribed value than said first drain voltage for measuring a second subthreshold current flowing through said first transistor;

means reading a first source voltage corresponding to a first value of said first subthreshold current and a second source voltage corresponding to a second value of said second subthreshold current equal to said first value; and means calculating the ratio of the difference between said first drain voltage and said second drain voltage to the difference between said first source voltage and said second source voltage thereby obtaining the coupling coefficient between said first gate electrode and said source region.

16. A coupling coefficient measuring apparatus for a semiconductor memory having a first gate electrode and a second gate electrode coupled at a prescribed electrostatic coupling ratio, comprising:

means increasing a voltage applied to said second gate electrode while setting a voltage applied to a source/drain region to a first voltage defining a reference value for measuring a first subthreshold current flowing through a first transistor having said first gate electrode as a gate;

means increasing said voltage applied to said second gate electrode while setting said voltage applied to said source/drain region to a second voltage higher by a prescribed value than said first voltage for measuring a second subthreshold current flowing through said first transistor;

means reading a third voltage of said second gate electrode corresponding to a first value of said first subthreshold current and a fourth voltage of said second gate electrode corresponding to a second value of said second subthreshold current equal to said first value; and means calculating the ratio of the difference between said first voltage and said second voltage of said source/drain region to the difference between said third voltage and said fourth voltage of said second gate electrode thereby obtaining the coupling coefficient between said first gate electrode and said second gate electrode.

17. A coupling coefficient measuring apparatus for a semiconductor memory having a first gate electrode and a second gate electrode coupled at a prescribed electrostatic coupling ratio with said first gate electrode and said second gate electrode serially arranged between a source region and a drain region, comprising:

means setting the maximum voltage of said second gate electrode smaller than a voltage obtained by adding the threshold voltage of a second transistor having said second gate electrode as a gate and a drain voltage in a data area employed as a correct measured value when applying a prescribed voltage to said second gate voltage in a prescribed memory cell thereby applying a voltage to said first gate electrode by electrostatic coupling and measuring a first subthreshold current between said source region and said drain region;

means directly applying a voltage to a test gate electrode in a test memory cell for measuring a second subthreshold current between said source region and said drain region;

means measuring inclination of said first subthreshold current and inclination of said second subthreshold current; and means calculating the ratio between said inclination of said first subthreshold current and said inclination of said second subthreshold current thereby obtaining the coupling coefficient between said first gate electrode and said second gate electrode.

* * * * *